(12) United States Patent
Zhong et al.

(10) Patent No.: US 12,031,920 B2
(45) Date of Patent: Jul. 9, 2024

(54) METHOD FOR DETECTING COVERAGE RATE OF INTERMETALLIC COMPOUND

(71) Applicant: Weifang Goertek Microelectronics Co., Ltd., Shandong (CN)

(72) Inventors: Dingguo Zhong, Shandong (CN); Dewen Tian, Shandong (CN); Qinglin Song, Shandong (CN)

(73) Assignee: Weifang Goertek Microelectronics Co., Ltd., Shandong (CN)

( * ) Notice: Subject to any disclaimer, the term of this patent is extended or adjusted under 35 U.S.C. 154(b) by 411 days.

(21) Appl. No.: 17/614,905

(22) PCT Filed: Dec. 6, 2019

(86) PCT No.: PCT/CN2019/123556
§ 371 (c)(1),
(2) Date: Nov. 29, 2021

(87) PCT Pub. No.: WO2020/238138
PCT Pub. Date: Dec. 3, 2020

(65) Prior Publication Data
US 2022/0236195 A1    Jul. 28, 2022

(30) Foreign Application Priority Data
May 28, 2019    (CN) .......................... 201910455864.5

(51) Int. Cl.
*G01N 21/84* (2006.01)
*G01N 1/32* (2006.01)
*G01N 21/95* (2006.01)

(52) U.S. Cl.
CPC .......... *G01N 21/9501* (2013.01); *G01N 1/32* (2013.01); *G01N 2021/8433* (2013.01)

(58) Field of Classification Search
None
See application file for complete search history.

(56) References Cited

U.S. PATENT DOCUMENTS

| | | | | |
|---|---|---|---|---|
| 2004/0018651 A1* | 1/2004 | Nadeau | .................... | H01L 21/56 438/15 |
| 2008/0230915 A1* | 9/2008 | Cho | ........................ | H01L 24/05 257/769 |
| 2008/0240975 A1* | 10/2008 | Cho | ........................ | H01L 24/45 420/501 |
| 2012/0263624 A1* | 10/2012 | Chiba | ..................... | H01L 24/48 420/505 |
| 2013/0082031 A1* | 4/2013 | Wagner | ..................... | C25F 3/00 156/345.18 |
| 2023/0138508 A1* | 5/2023 | Hendarto | ................ | H01L 24/48 438/127 |

FOREIGN PATENT DOCUMENTS

| CN | 107680919 A | 2/2018 |
|---|---|---|
| CN | 110146503 A | 8/2019 |

* cited by examiner

*Primary Examiner* — Cory W Eskridge
(74) *Attorney, Agent, or Firm* — Baker Botts LLP

(57) ABSTRACT

Disclosed is a method for detecting coverage rate of an intermetallic compound, the method comprising putting a chip subjected to wire bonding into a mixed reagent of fuming nitric acid and fuming sulfuric acid for soaking, wherein the chip subjected to wire bonding comprises a silver wire and an aluminum; taking out the chip after the silver wire is removed; and detecting the coverage rate of an intermetallic compound on the aluminum pad.

10 Claims, 2 Drawing Sheets

Putting a chip subjected to wire bonding into a mixed reagent of fuming nitric acid and fuming sulfuric acid for soaking, wherein the chip subjected to wire bonding includes a silver wire and an aluminum pad — S10

Taking out the chip after the silver wire is removed — S20

Detecting the coverage rate of an intermetallic compound on the aluminum pad — S30

METHOD FOR DETECTING COVERAGE RATE OF INTERMETALLIC COMPOUND

CROSS-REFERENCE TO RELATED APPLICATIONS

This application is a National Stage of International Application No. PCT/CN2019/123556, filed on Dec. 6, 2019, which claims priority to Chinese Patent Application No. 201910455864.5, filed on May 28, 2019, both of which are hereby incorporated by reference in its entirety.

TECHNICAL FIELD

The present disclosure relates to the technical field of circuit welding, and in particular to a method for detecting the coverage rate of an intermetallic compound.

BACKGROUND

In the chip packaging process, wire bonding (WB) is a process technology that connects a semiconductor die welding area with a microelectronic packaged input/output (I/O) wire or a metal wire for a metal wiring pad on a substrate. After wire bonding, an intermetallic compound (IMC) will be produced between the metal wire and the pad, the stability of the metal wire and the pad is generally judged by detecting the coverage rate of the IMC, and when the coverage rate of the IMC is too low, it indicates that the stability of the metal wire and the pad is poor, which may lead to wiring shedding and subsequent reliability failure.

When a silver wire is welded to an aluminum pad through wire bonding, it is necessary to remove the aluminum pad and overturn a welded ball if the coverage rate of the IMC is detected, but this overturning manner is difficult to operate and the overturning success rate is too low, and it is difficult to realize.

The above contents are only used to assist in understanding the technical solution of the present disclosure, and do not mean that the above contents are recognized as the prior art.

SUMMARY

An main objective of the present disclosure is to provide a method for detecting the coverage rate of an intermetallic compound, which aims to protect the integrity of the intermetallic compound while removing a silver wire through a mixed reagent of fuming nitric acid and fuming sulfuric acid so as to directly detect the coverage rate of the intermetallic compound, thereby avoiding the operation of overturning a welded ball.

To achieve the above objective, the present disclosure provides a method for detecting the coverage rate of an intermetallic compound. The method for detecting the coverage rate of the intermetallic compound includes the following steps:
  putting a chip subjected to wire bonding into a mixed reagent of fuming nitric acid and fuming sulfuric acid for soaking, wherein the chip subjected to wire bonding includes a silver wire and an aluminum pad;
  taking out the chip after the silver wire is removed; and
  detecting the coverage rate of an intermetallic compound on the aluminum pad.

Optionally, the soaking time of the chip in the mixed reagent is 8 min-12 min, and the soaking temperature is 20° C.-30° C.; and the mixed reagent comprises the following components in percentage by volume: 20%-50% of fuming nitric acid and 50%-80% of fuming sulfuric acid.

Optionally, the soaking time of the chip in the mixed reagent is 10 min, and the soaking temperature is 25° C.; and the mixed reagent comprises the following components in percentage by volume: 25% of fuming nitric acid and 75% of fuming sulfuric acid.

Optionally, before the step of putting the chip subjected to wire bonding into the mixed reagent of the fuming nitric acid and the fuming sulfuric acid for soaking, the method further includes:
  baking the chip in a nitrogen atmosphere; and
  cooling the chip after baking.

Optionally, the backing temperature is 150° C.-225° C., and the baking time is 1 h-24 h.

Optionally, the step of putting the chip subjected to wire bonding into the mixed reagent of the fuming nitric acid and the fuming sulfuric acid for soaking includes:
  putting the chip into the mixed reagent with a surface of the chip facing up, which surface having the silver wire attached thereto.

Optionally, before the step of detecting the coverage rate of the intermetallic compound on the aluminum pad, the method further includes:
  performing deionized water flushing and ultrasonic washing on the chip with the silver wire removed; and
  drying the washed chip.

Optionally, the ultrasonic washing reagent is industrial acetone, and the ultrasonic washing time is 0.5 min-1.5 min.

Optionally, the step of drying the washed chip includes the following steps:
  blow-drying the washed chip through nitrogen, wherein the drying time is 1 min-1 min.

Optionally, the step of detecting the coverage rate of the intermetallic compound on the aluminum pad includes:
  acquiring an image of the intermetallic compound on the aluminum pad through a metalloscope, and acquiring the coverage rate according to the image.

According to the method for detecting the coverage rate of the intermetallic compound provided by the embodiment of the present disclosure, the chip subjected to wire bonding is put into the mixed reagent of the fuming nitric acid and the fuming sulfuric acid for soaking, the chip is taken out after the silver wire is removed, and the coverage of the intermetallic compound on the aluminum pad is detected. According to the present disclosure, the silver wire is removed through the fuming nitric acid in the mixed reagent, so that the coverage rate of the intermetallic compound is directly detected and the operation of overturning the welded ball is avoided; a protective layer is generated on the surface of the intermetallic compound by the fuming sulfuric acid in the mixed reagent, so that corrosion intermetallic compound is slowed down; and by controlling the volume ratio, the soaking temperature and the soaking time of the fuming nitric acid and the fuming sulfuric acid, the corrosion to the intermetallic compound is slowed down as much as possible while the silver wire is removed, so that the coverage rate of the intermetallic compound can be ensured to be directly detected, and the detection result is more accurate.

The implementation of objectives, functional characteristics, and advantages of the present disclosure will be further described with reference to the accompanying drawings.

DETAILED DESCRIPTION OF EMBODIMENTS

It should be understood that the described specific embodiments are merely used to explain the present disclosure, rather than to limit the present disclosure.

The main solution of the embodiment of the present disclosure is as follows:

a chip subjected to wire bonding was put into a mixed reagent of fuming nitric acid and fuming sulfuric acid for soaking, wherein the chip subjected to wire bonding includes a silver wire and an aluminum pad;

the chip was taken out after the silver wire was removed; and detecting the coverage rate of an intermetallic compound on the aluminum pad.

In the prior art, when a silver wire was welded to an aluminum pad through wire bonding, it was necessary to remove the aluminum pad and overturn a welded ball if the coverage rate of the IMC was detected, but this overturning manner is difficult to operate and the overturning success rate is too low, and it is difficult to realize.

The present disclosure provides a solution, which protects the integrity of the intermetallic compound while removing a silver wire through a mixed reagent of fuming nitric acid and fuming sulfuric acid so as to directly detect the coverage rate of the intermetallic compound, thereby avoiding the operation of overturning a welded ball.

Figure 1:
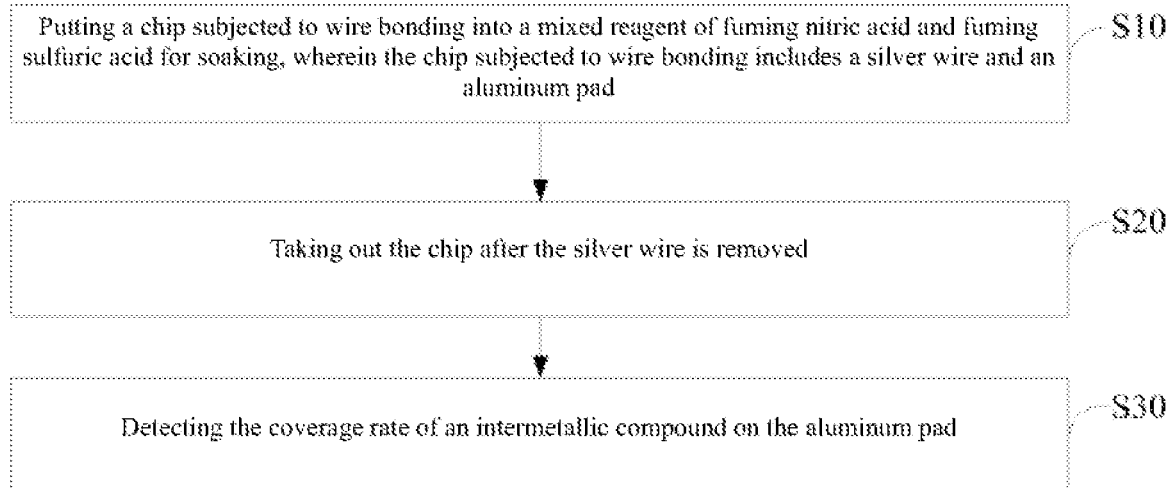
FIG. 1 is a schematic flowchart of an embodiment of a method for detecting the coverage rate of an intermetallic compound according to the present disclosure.

Referring to FIG. 1, in one embodiment, the method for detecting the coverage rate of the intermetallic compound includes the following steps:

step S10: a chip subjected to wire bonding was put into a mixed reagent of fuming nitric acid and fuming sulfuric acid for soaking, wherein the chip subjected to wire bonding includes a silver wire and an aluminum pad.

In this embodiment, a chip subjected to wire bonding was put into a mixed reagent of fuming nitric acid and fuming sulfuric acid for soaking, wherein the chip subjected to wire bonding includes a silver wire and an aluminum pad. In the specific reaction process, the fuming nitric acid reacted with silver to generate silver nitrate, nitrogen dioxide and water, so as to corrode the silver wire. The specific reaction equation is:

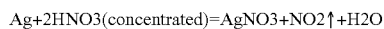

The fuming sulfuric acid can only react with the silver under the heating condition, and the removal of the silver wire is mainly realized by the fuming nitric acid in the mixed reagent. The intermetallic compound between the silver wire and the aluminum pad is also corroded by the mixed reagent, and the fuming sulfuric acid is mainly used to slow down the corrosion to the intermetallic compound. The mixed reagent of the fuming nitric acid and the fuming sulfuric acid may passivate the aluminum pad to generate a dense aluminum oxide film, and the specific reaction equations are:

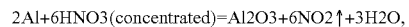

Accordingly, the aluminum pad will not be corroded.

In addition, the intermetallic compound is an aluminum silver compound formed by welding the silver wire and the aluminum pad, may slowly react with the fuming nitric acid and cannot generate the aluminum oxide film so as to be corroded, but the intermetallic compound may form the aluminum oxide film under the action of the fuming sulfuric acid so as to slow down the corrosion to the intermetallic compound, thereby ensuring the integrity of the intermetallic compound after the silver wire is removed. When the mixed reagent of the fuming nitric acid and the fuming sulfuric acid is prepared, the fuming nitric acid and the fuming sulfuric acid may be mixed in any commonly used volume ratio. In order to ensure that the corrosion to the intermetallic compound is slowed down to the greatest extent while the silver wire is removed, preferably, the soaking time of the chip in the mixed reagent is 8 min-12 min, and the soaking temperature is 20° C.-30° C.; and the mixed reagent includes the following components in percentage by volume: 20%-50% of fuming nitric acid and 50%-80% of fuming sulfuric acid. Nitrogen dioxide gas was released in the reaction process to damage the aluminum oxide film, and preferably, when the chip subjected to wire bonding was put into the mixed reagent of the fuming nitric acid and the fuming sulfuric acid, a surface of the chip with the silver wire was put facing up into the mixed reagent, thereby reducing the speed of damaging the aluminum oxide film. Certainly, the mixed reagent may be dripped on the silver wire through a drip tube, but this manner has too low efficiency, and it is dangerous to operate due to that the mixed reagent is a strong acid reagent.

Step S20: the chip was taken out after the silver wire was removed.

Step S30: the coverage rate of the intermetallic compound on the aluminum pad was detected.

In this embodiment, since the thickness of the intermetallic compounds on different chips may be different, the soaking time may also be different before the chip is taken out, which is generally based on that the gray-yellow intermetallic compound may be observed by naked eyes after the silver wire is removed. Preferably, the soaking time is 8 min-12 min. After the chip was taken out, an image of the intermetallic compound on the aluminum pad was acquired through a metalloscope, the coverage rate was obtained according to the image, then multiple groups chips or a plurality of aluminum pads were subjected to the steps (1) and (2) repeatedly to obtain multiple groups of coverage rate values, and an average value was calculated as the coverage rate result after the abnormal value in the coverage rate was removed, wherein the coverage rate may be specifically calculated by a tool such as a software program, and the normal coverage rate is generally greater than 70%, which is not elaborated herein.

In the technical solution disclosed by this embodiment, the silver wire is removed through the fuming nitric acid in the mixed reagent, so that the coverage rate of the intermetallic compound is directly detected and the operation of overturning the welded ball is avoided; a protective layer is generated on the surface of the intermetallic compound by the fuming sulfuric acid in the mixed reagent, so that corrosion to the intermetallic compound is slowed down;

and by controlling the volume ratio, the soaking temperature and the soaking time of the fuming nitric acid and the fuming sulfuric acid, the corrosion to the intermetallic compound is slowed down as much as possible while the silver wire is removed, so that the coverage rate of the intermetallic compound can be ensured to be directly detected, and the detection result is more accurate.

Figure 2:
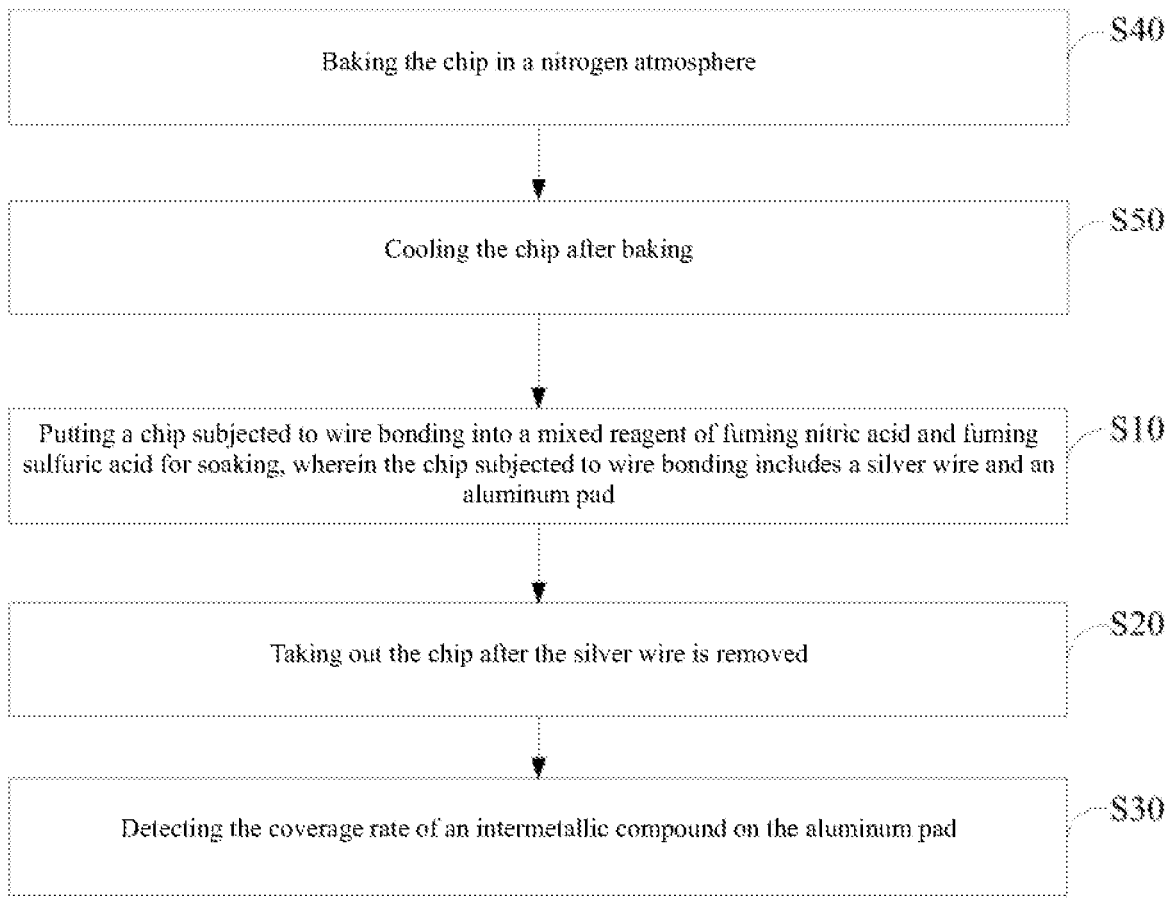
FIG. 2 is a schematic flowchart of another embodiment of a method for detecting the coverage rate of an intermetallic compound according to the present disclosure.

In another embodiment, as shown in FIG. 2, based on the embodiment as shown in FIG. 1, before the step S10, the method further includes:

step S40: the chip was baked in a nitrogen atmosphere.

In this embodiment, in the process of putting the chip subjected to wire bonding into the mixed reagent of the fuming nitric acid and the fuming sulfuric acid for soaking, it will inevitably cause a certain degree of corrosion to the intermetallic compound. Therefore, preferably, before soaking, the chip was baked in the nitrogen atmosphere, and the chip was cooled after baking, so that the intermetallic compound can grow longitudinally and the thickness increases. In this way, in a case that the intermetallic compound is corroded to a certain degree, detection of the intermetallic compound will not be affected, wherein the nitrogen atmosphere may prevent the silver wire from being oxidized, so that the corrosion rate of the silver wire is ensured. If the baking temperature is too high and the baking time is too long, the intermetallic compound will be too thick, so that the detected coverage rate of the intermetallic compound will be distorted. Preferably, the baking temperature is 150° C.-225° C., and the baking time is 1 h-24 h.

Step S50: the chip was cooled after baking.

In this embodiment, after baking, if the chip is directly put into the mixed reagent of the fuming nitric acid and the fuming sulfuric acid, the intermetallic compound in the chip at high temperature will react with the fuming sulfuric acid to accelerate the corrosion to the intermetallic compound; therefore, after baking, it is necessary to cool the chip, generally to a room temperature.

In the technical solution disclosed by this embodiment, the chip is baked in the nitrogen atmosphere, and the chip is cooled after baking, so that the thickness of the intermetallic compound increases, and the accuracy of the detected coverage rate of the intermetallic compound is improved.

Figure 3:
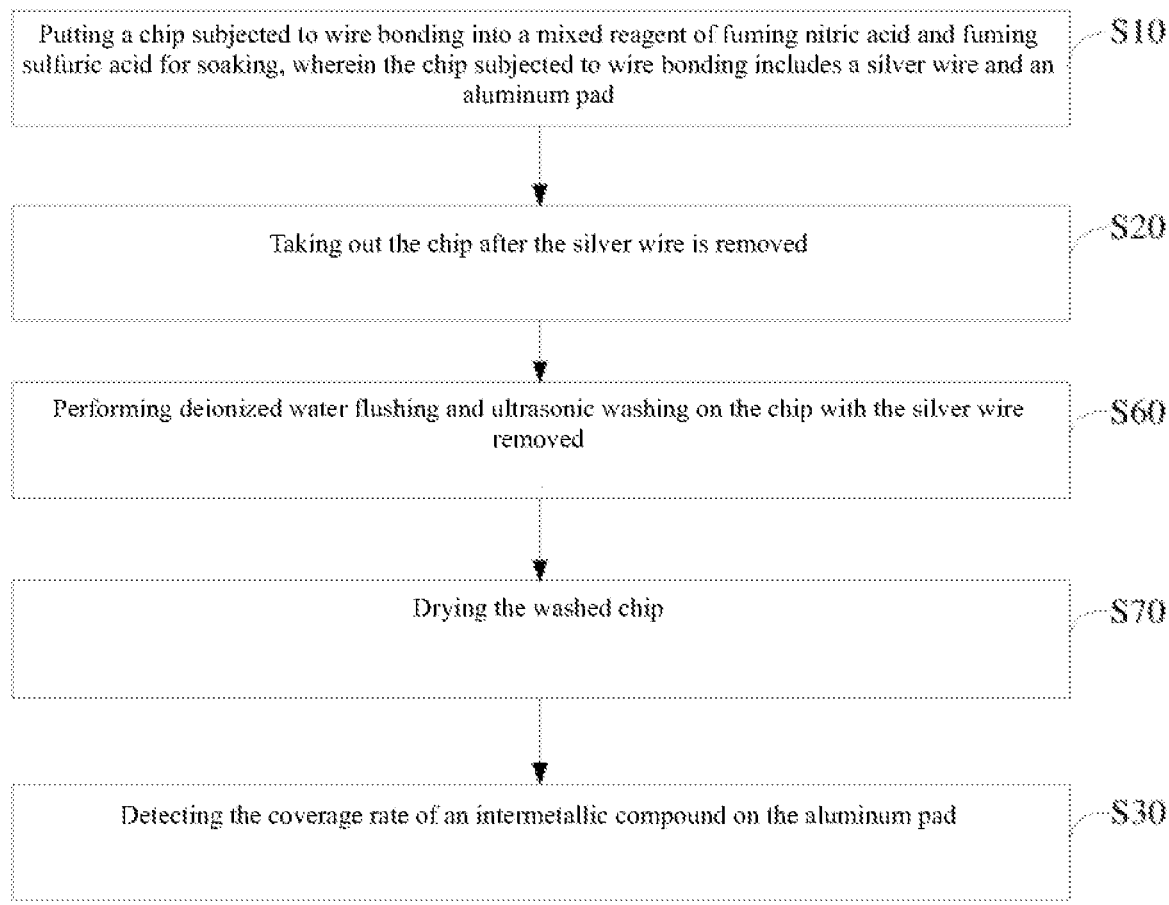
FIG. 3 is a schematic flowchart of yet another embodiment of a method for detecting the coverage rate of an intermetallic compound according to the present disclosure.

In yet another embodiment, as shown in FIG. 3, based on the embodiment as shown in FIG. 1, before the step S30, the method further includes:

step S60: the chip with the silver wire removed was subjected to deionized water flushing and ultrasonic washing; and step S70: the washed chip was dried.

In this embodiment, before the coverage rate was detected, the chip with the silver wire removed may be washed and dried to remove the residue of the reagent such as the fuming nitric acid and the fuming sulfuric acid, so that the influence on the coverage rate detection by these factors is reduced. Firstly, the chip was washed with the deionized water and then was washed ultrasonically after washing. Preferably, the ultrasonic washing reagent is industrial acetone, and the ultrasonic washing time is 0.5 min-1.5 min. After ultrasonic washing, the chip was dried. Preferably, the washed chip was blow-dried by nitrogen, wherein the drying time is 1 min-3 min, and the blow drying with nitrogen will avoid oxidation of the intermetallic compound.

In the technical solution disclosed by this embodiment, the chip with the silver wire removed is subjected to deionized water flushing and ultrasonic washing, and the washed chip is dried, so that the influence on the coverage rate detection by the factors such as the residue of the reagent is reduced, and the accuracy of the detected coverage rate is improved.

Based on the solution described in any one of the above embodiments, the following test experiments may be conducted to detect the feasibility of the method for detecting the coverage rate of the intermetallic compound.

Test Experiment 1

Silver wire removal: a chip subjected to wire bonding was put into a baking box, the baking box was filled with nitrogen, and baking was started at 150° C. for 24 h after the baking box was full of the nitrogen. After baking, the chip was naturally cooled to a room temperature. At the reaction temperature of 30° C., a surface of the cooled chip with the silver wire was put facing up into a mixed reagent for soaking for 12 min, and the chip was taken out after the soaking time was reached, wherein the mixed reagent includes the following components in percentage by volume: 50% of fuming nitric acid and 50% of fuming sulfuric acid.

Coverage rate detection: the chip was washed with deionized water and then was put into an ultrasonic washing machine for washing, wherein the ultrasonic washing reagent is industrial acetone, and the ultrasonic washing time is 0.5 min. The washed chip was dried for 1 min by a nitrogen blow-drying apparatus, the dried chip was put down a metalloscope, and the coverage rate of the intermetallic compound was red through a computer program associated with the metalloscope. 10 groups of coverage rate values were obtained by performing the steps of silver wire removal and coverage rate detection on 10 groups of chips, and an average number was taken as the coverage rate result 1 of this test experiment after the abnormal values in the 10 coverage rate values were removed.

In this test experiment, the soaking time of the chip in the mixed reagent is 12 min, and the soaking temperature is 30° C.; and the mixed reagent includes the following components in percentage by volume: 50% of fuming nitric acid and 50% of fuming sulfuric acid.

Through detection, the coverage rate result 1 of the test experiment is 95.5%, which is in a normal coverage rate range, it can be seen that the coverage rate result is valid, and the method of this test experiment may be used to detect the coverage rate of the intermetallic compound.

Test Experiment 2

Silver wire removal: a chip subjected to wire bonding was put into a baking box, the baking box was filled with nitrogen, and baking was started at 175° C. for 12 h after the baking box was full of the nitrogen. After baking, the chip was naturally cooled to a room temperature. At the reaction temperature of 20° C., a surface of the cooled chip with the silver wire was put facing up into a mixed reagent for soaking for 8 min, and the chip was taken out after the soaking time was reached, wherein the mixed reagent includes the following components in percentage by volume: 20% of fuming nitric acid and 80% of fuming sulfuric acid.

Coverage rate detection: the chip was washed with deionized water and then was put into an ultrasonic washing machine for washing, wherein the ultrasonic washing reagent is industrial acetone, and the ultrasonic washing time is 1 min. The washed chip was dried for 2 min by a nitrogen blow-drying apparatus, the dried chip was put down a metalloscope, and the coverage rate of the intermetallic compound was red through a computer program associated with the metalloscope. 10 groups of coverage rate values were obtained by performing the steps of silver wire removal and coverage rate detection on 10 groups of chips, and an average number was taken as the coverage rate result 2 of this test experiment after the abnormal values in the 10 coverage rate values were removed.

In this test experiment, the soaking time of the chip in the mixed reagent is 8 min, and the soaking temperature is 20° C.; and the mixed reagent includes the following components in percentage by volume: 20% of fuming nitric acid and 80% of fuming sulfuric acid.

Through detection, the coverage rate result 2 of the test experiment is 96.3%, which is in a normal coverage rate range, it can be seen that the coverage rate result is valid, and the method of this test experiment may be used to detect the coverage rate of the intermetallic compound.

Test Experiment 3

Silver wire removal: a chip subjected to wire bonding was put into a baking box, the baking box was filled with nitrogen, and baking was started at 225° C. for 1 h after the baking box was full of the nitrogen. After baking, the chip was naturally cooled to a room temperature. At the reaction temperature of 27° C., a surface of the cooled chip with the silver wire was put facing up into a mixed reagent for soaking for 11 min, and the chip was taken out after the soaking time was reached, wherein the mixed reagent includes the following components in percentage by volume: 40% of fuming nitric acid and 60% of fuming sulfuric acid.

Coverage rate detection: the chip was washed with deionized water and then was put into an ultrasonic washing machine for washing, wherein the ultrasonic washing reagent is industrial acetone, and the ultrasonic washing time is 1.5 min. The washed chip was dried for 3 min by a nitrogen blow-drying apparatus, the dried chip was put down a metalloscope, and the coverage rate of the intermetallic compound was red through a computer program associated with the metalloscope. 10 groups of coverage rate values were obtained by performing the steps of silver wire removal and coverage rate detection on 10 groups of chips, and an average number was taken as the coverage rate result 3 of this test experiment after the abnormal values in the 10 coverage rate values were removed.

In this test experiment, the soaking time of the chip in the mixed reagent is 11 min, and the soaking temperature is 27° C.; and the mixed reagent includes the following components in percentage by volume: 40% of fuming nitric acid and 60% of fuming sulfuric acid.

Through detection, the coverage rate result 3 of the test experiment is 97.4%, which is in a normal coverage rate range, it can be seen that the coverage rate result is valid, and the method of this test experiment may be used to detect the coverage rate of the intermetallic compound.

Test Experiment 4

Silver wire removal: a chip subjected to wire bonding was put into a baking box, the baking box was filled with nitrogen, and baking was started at 200° C. for 12 h after the baking box was full of the nitrogen. After baking, the chip was naturally cooled to a room temperature. At the reaction temperature of 23° C., a surface of the cooled chip with the silver wire was put facing up into a mixed reagent for soaking for 9 min, and the chip was taken out after the soaking time was reached, wherein the mixed reagent includes the following components in percentage by volume: 30% of fuming nitric acid and 70% of fuming sulfuric acid.

Coverage rate detection: the chip was washed with deionized water and then was put into an ultrasonic washing machine for washing, wherein the ultrasonic washing reagent is industrial acetone, and the ultrasonic washing time is 1 min. The washed chip was dried for 3 min by a nitrogen blow-drying apparatus, the dried chip was put down a metalloscope, and the coverage rate of the intermetallic compound was red through a computer program associated with the metalloscope. 10 groups of coverage rate values were obtained by performing the steps of silver wire removal and coverage rate detection on 10 groups of chips, and an average number was taken as the coverage rate result 4 of this test experiment after the abnormal values in the 10 coverage rate values were removed.

In this test experiment, the soaking time of the chip in the mixed reagent is 9 min, and the soaking temperature is 23° C.; and the mixed reagent includes the following components in percentage by volume: 30% of fuming nitric acid and 70% of fuming sulfuric acid.

Through detection, the coverage rate result 4 of the test experiment is 97.9%, which is in a normal coverage rate range, it can be seen that the coverage rate result is valid, and the method of this test experiment may be used to detect the coverage rate of the intermetallic compound.

Test Experiment 5

Silver wire removal: a chip subjected to wire bonding was put into a baking box, the baking box was filled with nitrogen, and baking was started at 200° C. for 1 h after the baking box was full of the nitrogen. After baking, the chip was naturally cooled to a room temperature. At the reaction temperature of 25° C., a surface of the cooled chip with the silver wire was put facing up into a mixed reagent for soaking for 10 min, and the chip was taken out after the soaking time was reached, wherein the mixed reagent includes the following components in percentage by volume: 25% of fuming nitric acid and 75% of fuming sulfuric acid.

Coverage rate detection: the chip was washed with deionized water and then was put into an ultrasonic washing machine for washing, wherein the ultrasonic washing reagent is industrial acetone, and the ultrasonic washing time is 0.5 min. The washed chip was dried for 2 min by a nitrogen blow-drying apparatus, the dried chip was put down a metalloscope, and the coverage rate of the intermetallic compound was red through a computer program associated with the metalloscope. 10 groups of coverage rate values were obtained by performing the steps of silver wire removal and coverage rate detection on 10 groups of chips, and an average number was taken as the coverage rate result 5 of this test experiment after the abnormal values in the 10 coverage rate values were removed.

In this test experiment, the soaking time of the chip in the mixed reagent is 10 min, and the soaking temperature is 25° C.; and the mixed reagent includes the following components in percentage by volume: 25% of fuming nitric acid and 75% of fuming sulfuric acid.

Through detection, the coverage rate result 5 of the test experiment is 98.5%, which is in a normal coverage rate range, it can be seen that the coverage rate result is valid, and the method of this test experiment may be used to detect the coverage rate of the intermetallic compound.

It may be seen from the above results that any one of the test experiments 1-5 may detect the coverage rate of the intermetallic compound through the metalloscope, and the coverage rate of the intermetallic compound detected by any one of the test experiments 1-5 is in the normal coverage rate range, therefore, the coverage rate results are valid, and test experiments can be used to detect the coverage rate of the intermetallic compound, the integrity of the intermetallic compound is protected while the silver wire is removed through the mixed reagent of the fuming nitric acid and the fuming sulfuric acid, the coverage rate of the intermetallic compound is directly detected, and the operation of overturning the welded ball is avoided.

In addition, in the chips subjected to wire bonding by the same production process, the coverage rate of the intermetallic compound itself is very close, and it can be considered that the coverage rate of the intermetallic compound itself in each chip is the same. Therefore, in the test experiments 1-5, the larger the coverage rate detected by the metalloscope is, the closer it is to the coverage rate of the intermetallic compound itself, and the more accurate the detected coverage rate result is. In the test experiments 1-5, the coverage rate results become larger in the following order: the coverage rate result 1, the coverage rate result 2, the coverage rate result 3, the coverage rate result 4 and the coverage rate result 5; therefore, the accuracy of the detected coverage rate becomes better in the following order: the coverage rate result 1, the coverage rate result 2, the coverage rate result 3, the coverage rate result 4 and the coverage rate result 5.

It should be noted that in this specification, the terms "comprise", "include" and any other variants thereof are intended to cover non-exclusive inclusion, so that a process, a method, an article, or a system that includes a series of system only includes these very elements, but may also include other elements not expressly listed, or also include elements inherent to this process, method, article, or system. An element limited by "includes a . . . " does not, without more constraints, preclude the presence of additional identical elements in the process, method, article, or system that includes the element.

The sequence numbers of the foregoing embodiments of the present disclosure are merely for the purpose of description and do not represent advantages and disadvantages of the embodiments.

Described above are only preferred embodiments of the present disclosure and are not intended to limit the patent scope of the present disclosure. Any equivalent structure or flow variant based on contents of the specification and the accompanying drawings of the present disclosure or directly/indirectly applied to other related technical fields within the conception of the present disclosure shall fall within the patent protection scope of the present disclosure.

The invention claimed is:

1. A method for detecting a coverage rate of an intermetallic compound, comprising:
    putting a chip subjected to wire bonding into a mixed reagent of fuming nitric acid and fuming sulfuric acid for soaking, wherein the chip subjected to wire bonding comprises a silver wire and an aluminum pad;
    taking out the chip after the silver wire is removed; and
    detecting the coverage rate of an intermetallic compound on the aluminum pad.

2. The method for detecting the coverage rate of the intermetallic compound of claim 1, wherein the soaking comprises soaking of the chip in the mixed reagent for 8 min-12 min at 20° C.-30° C. and
    the mixed reagent comprises the following components in percentage by volume:
        20%-50% of the fuming nitric acid, and
        50%-80% of the fuming sulfuric acid.

3. The method for detecting the coverage rate of the intermetallic compound of claim 1, wherein the soaking comprises soaking the chip in the mixed reagent for 10 min at 25° C.; and the mixed reagent comprises the following components in percentage by volume:
    25% of the fuming nitric acid, and
    75% of the fuming sulfuric acid.

4. The method for detecting the coverage rate of the intermetallic compound of claim 1, further comprising, before the putting the chip subjected to wire bonding into the mixed reagent of the fuming nitric acid and the fuming sulfuric acid for soaking:
    baking the chip in a nitrogen atmosphere; and
    cooling the chip after baking.

5. The method for detecting the coverage rate of the intermetallic compound of claim 4, wherein the baking comprises baking at 150° C.-225° C. for 1 h-24 h.

6. The method for detecting the coverage rate of the intermetallic compound of claim 1, wherein the step-of putting the chip subjected to wire bonding into the mixed reagent of the fuming nitric acid and the fuming sulfuric acid for soaking comprises:
    putting the chip into the mixed reagent with a surface of the chip facing up that has the silver wire attached thereto.

7. The method for detecting the coverage rate of the intermetallic compound of claim 1, further comprising, before the detecting the coverage rate of the intermetallic compound on the aluminum pad:
    performing deionized water flushing and ultrasonic washing on the chip with the silver wire removed; and
    drying the washed chip.

8. The method for detecting the coverage rate of the intermetallic compound of claim 7, wherein the ultrasonic washing reagent is industrial acetone, and the ultrasonic washing comprises washing for 0.5 min-1.5 min.

9. The method for detecting the coverage rate of the intermetallic compound of claim 7, wherein the drying the washed chip comprises:
    blow-drying the washed chip through nitrogen, for 1 min-3 min.

10. The method for detecting the coverage rate of the intermetallic compound of claim 1, wherein the detecting the coverage rate of the intermetallic compound on the aluminum pad composes:
    acquiring an image of the intermetallic compound on the aluminum pad through a metalloscope, and acquiring the coverage rate according to the image.

* * * * *